United States Patent
Kher et al.

(10) Patent No.: US 8,163,343 B2
(45) Date of Patent: Apr. 24, 2012

(54) METHOD OF FORMING AN ALUMINUM OXIDE LAYER

(75) Inventors: Shreyas S. Kher, Campbell, CA (US); Christopher S. Olsen, Fremont, CA (US); Lucien Date, Ottignies LLN (BE)

(73) Assignee: Applied Materials, Inc., Santa Clara, CA (US)

( * ) Notice: Subject to any disclaimer, the term of this patent is extended or adjusted under 35 U.S.C. 154(b) by 831 days.

(21) Appl. No.: 12/203,647

(22) Filed: Sep. 3, 2008

(65) Prior Publication Data

US 2010/0055905 A1 Mar. 4, 2010

(51) Int. Cl.
*C23C 16/40* (2006.01)
(52) U.S. Cl. .................. 427/255.34; 427/255.7
(58) Field of Classification Search ............ 427/255.34, 427/255.7; 438/681, 688
See application file for complete search history.

(56) References Cited

U.S. PATENT DOCUMENTS

| | | | |
|---|---|---|---|
| 6,037,003 A * | 3/2000 | Gordon et al. ........... 427/255.34 |
| 7,026,219 B2 | 4/2006 | Pomarede et al. |
| 2004/0071879 A1 * | 4/2004 | Callegari et al. ......... 427/255.28 |
| 2004/0238895 A1 * | 12/2004 | Mutou .......................... 257/368 |
| 2004/0241322 A1 * | 12/2004 | Basceri et al. ........... 427/255.28 |
| 2005/0020060 A1 | 1/2005 | Aaltonen et al. |
| 2005/0217568 A1 | 10/2005 | Rupich et al. |
| 2005/0233529 A1 * | 10/2005 | Pomarede et al. ............ 438/287 |
| 2005/0271817 A1 * | 12/2005 | Kim et al. ................ 427/255.28 |

* cited by examiner

*Primary Examiner* — Matthew Daniels
*Assistant Examiner* — Erin Snelting
(74) *Attorney, Agent, or Firm* — Moser Taboada; Alan Taboada

(57) ABSTRACT

Methods of forming aluminum oxide layers on substrates are disclosed. In some embodiments, the method includes depositing an aluminum oxide seed layer on the substrate using a first process having a first deposition rate. The method further includes depositing a bulk aluminum oxide layer atop the seed layer using a metalorganic chemical vapor deposition (MOCVD) process having a second deposition rate greater than the first deposition rate.

23 Claims, 3 Drawing Sheets

METHOD OF FORMING AN ALUMINUM OXIDE LAYER

BACKGROUND OF THE INVENTION

1. Field of the Invention

Embodiments of the present invention relate to the field of semiconductor processing and more particularly, to a method for forming an aluminum oxide layer using metalorganic chemical vapor deposition (MOCVD).

2. Description of the Related Art

As the size of features in semiconductor devices continue to shrink, there is a continuing need to improve the quality of the individual deposited layers comprising a semiconductor device. Some processes, such as metalorganic chemical vapor deposition (MOCVD), offer an improved deposition rate and film quality for depositing layers, such as aluminum oxide ($Al_2O_3$). Unfortunately, and although film quality (i.e., dielectric properties, insulating properties) are improved over non-MOCVD techniques, the physical quality of the layer surface remains rough. In an $Al_2O_3$ layer, for instance, being utilized as a dielectric layer between a pair conducting layers, the surface roughness can facilitate dielectric breakdown. Unfortunately, while surface roughness can be reduced by a slower deposition rate, the resultant layer has reduced film quality and the process operates at a lower throughput.

Accordingly, there is a need in the art for a method of forming aluminum oxide layers using MOCVD having an improved deposition rate and film quality, and reduced surface roughness.

SUMMARY OF THE INVENTION

Embodiments of the present invention disclose methods of forming aluminum oxide layers on substrates using metalorganic chemical vapor deposition (MOCVD). In some embodiments, the method includes depositing an aluminum oxide seed layer on the substrate using a first process having a first deposition rate, then depositing a bulk aluminum oxide layer atop the seed layer using a MOCVD process having a second deposition rate greater than the first deposition rate.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods of forming an aluminum oxide layer on a substrate using metalorganic chemical vapor deposition (MOCVD) are provided herein. In some embodiments, the method includes depositing an aluminum oxide ($Al_2O_3$) seed layer on the substrate using a first process having a first deposition rate, and depositing a bulk aluminum oxide ($Al_2O_3$) layer atop the seed layer using a MOCVD process having a second deposition rate greater than the first deposition rate. The method may advantageously reduce surface roughness in the bulk $Al_2O_3$ layer while maintaining a high deposition rate and layer quality.

Figure 1:
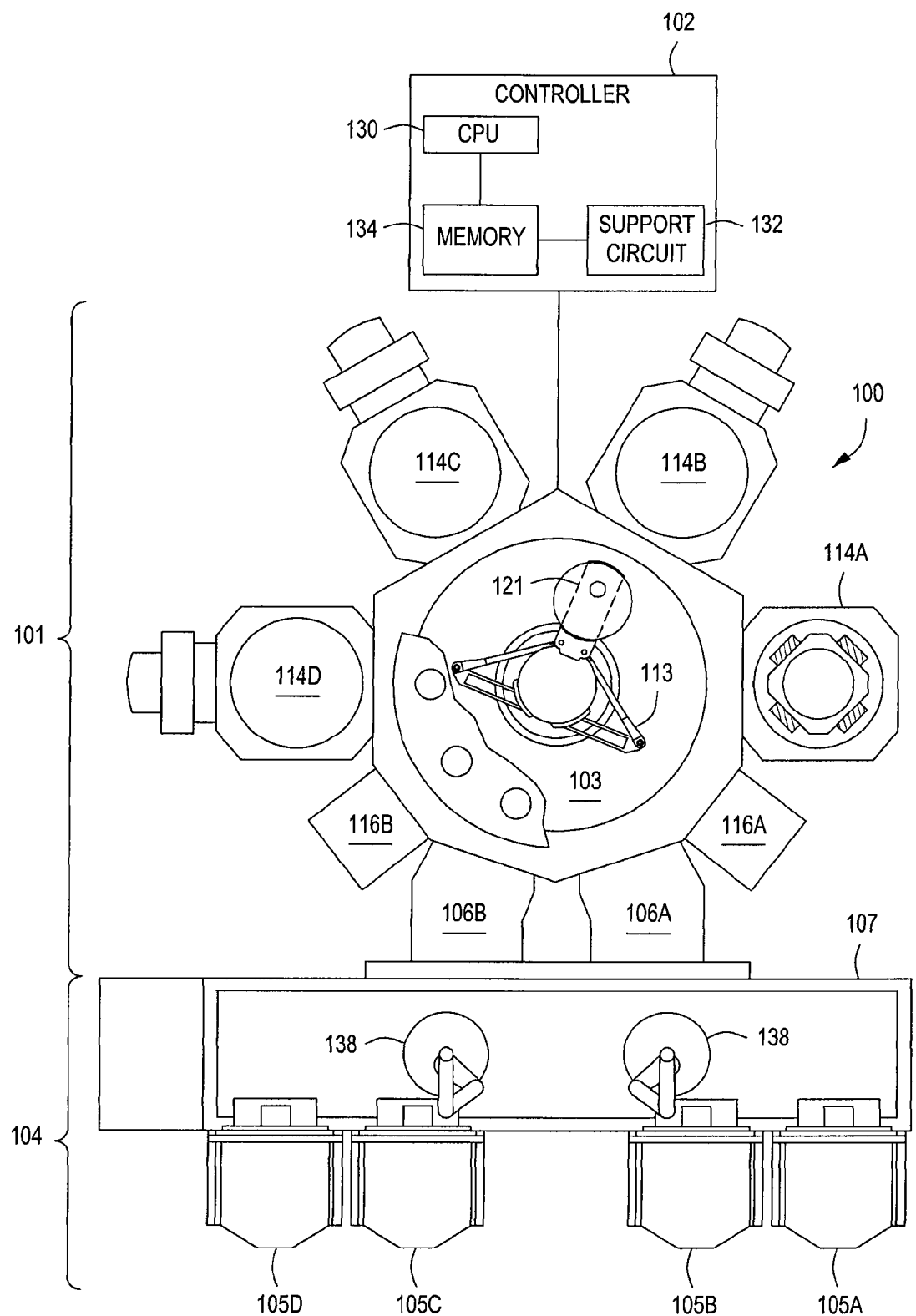
FIG. 1 illustrates a schematic diagram of an exemplary integrated semiconductor substrate processing system (i.e., a cluster tool) of the kind used in some embodiments of the invention.

FIG. 1 is a schematic view of an integrated tool 100 (i.e., a cluster tool) suitable for processing semiconductor substrates according to embodiments of the present invention. Examples of the integrated tool 100 include the CENTURA® and ENDURA® integrated tool, both available from Applied Materials, Inc., of Santa Clara, Calif. It is contemplated that the methods described herein may be practiced using other tools having suitable process chambers coupled thereto.

The integrated tool 100 includes a vacuum-tight processing platform 101, a factory interface 104, and a system controller 102. The platform 101 comprises multiple processing chambers, such as 114A, 114B, 114C, and 114D operatively coupled to a vacuum substrate transfer chamber 103. The factory interface 104 is operatively coupled to the transfer chamber 103 by one or more load lock chambers (two load lock chambers, such as 106A and 106B shown in FIG. 1).

In some embodiments, the factory interface 104 comprises at least one docking station 107, at least one factory interface robot 138 to facilitate the transfer of the semiconductor substrates. The docking station 107 is configured to accept one or more front opening unified pod (FOUP). Four FOUPS, such as 105A, 105B, 105C, and 105D are shown in the embodiment of FIG. 1. The factory interface robot 138 is configured to transfer the substrates from the factory interface 104 to the processing platform 101 through the loadlock chambers, such as 106A and 106B. Each of the loadlock chambers 106A and 106B have a first port coupled to the factory interface 104 and a second port coupled to the transfer chamber 103. The load lock chamber 106A and 106B are coupled to a pressure control system (not shown) which pumps down and vents the chambers 106A and 106B to facilitate passing the substrates between the vacuum environment of the transfer chamber 103 and the substantially ambient (e.g., atmospheric) environment of the factory interface 104. The transfer chamber 103 has a vacuum robot 113 disposed therein. The vacuum robot 113 is capable of transferring substrates 121 between the load lock chamber 106A and 106B and the processing chambers 114A, 114B, 114C, and 114D.

In some embodiments, the processing chambers 114A, 114B, 114C, and 114D, are coupled to the transfer chamber 103. The processing chambers 114A, 114B, 114C, and 114D comprise at least one of an Atomic Layer Deposition (ALD) chamber, a metalorganic CVD (MOCVD) chamber, or a Chemical Vapor Deposition (CVD) chamber. In some embodiments, the ALD, MOCVD, or CVD chambers may be used to deposit the $Al_2O_3$ seed layer at a first deposition rate, then the bulk $Al_2O_3$ layer is deposited in the MOCCVD chamber at a second deposition rate, wherein the second deposition rate is greater than the first deposition rate. An annealing chamber, such as a RTP chamber, may also be interchangeably incorporated into the integrated tool 100 in accordance with process requirements. Such requirements may include a post deposition anneal of the deposited $Al_2O_3$ layer. Examples of chambers suitable for performing at least some of the embodiments of the invention may include GEMINI ALD or CVD chambers available from Applied Materials, Inc., of Santa Clara, Calif.

In some embodiments, one or more optional service chambers (shown as 116A and 116B) may be coupled to the transfer chamber 103. The service chambers 116A and 116B may be configured to perform other substrate processes, such as degassing, orientation, substrate metrology, cool down and the like.

The system controller 102 controls the operation of the tool 100 using a direct control of the process chambers 114A, 114B, 114C, and 114D or alternatively, by controlling the computers (or controllers) associated with the process chambers 114A, 114B, 114C, and 114D and the tool 100. In operation, the system controller 102 enables data collection and feedback from the respective chambers and systems to optimize performance of the tool 100. The system controller 102 generally includes a Central Processing Unit (CPU) 130, a memory 134, and a support circuit 132. The CPU 130 may be one of any form of a general purpose computer processor that can be used in an industrial setting. The support circuit 132 is conventionally coupled to the CPU 130 and may comprise a cache, clock circuits, input/output subsystems, power supplies, and the like. Software routines, such as a method of forming an $Al_2O_3$ layer on a substrate as described below with reference to FIG. 2, when executed by the CPU 130, transform the CPU 130 into a specific purpose computer (controller) 102. The software routines may also be stored and/or executed by a second controller (not shown) that is located remotely from the tool 100.

Figure 2:
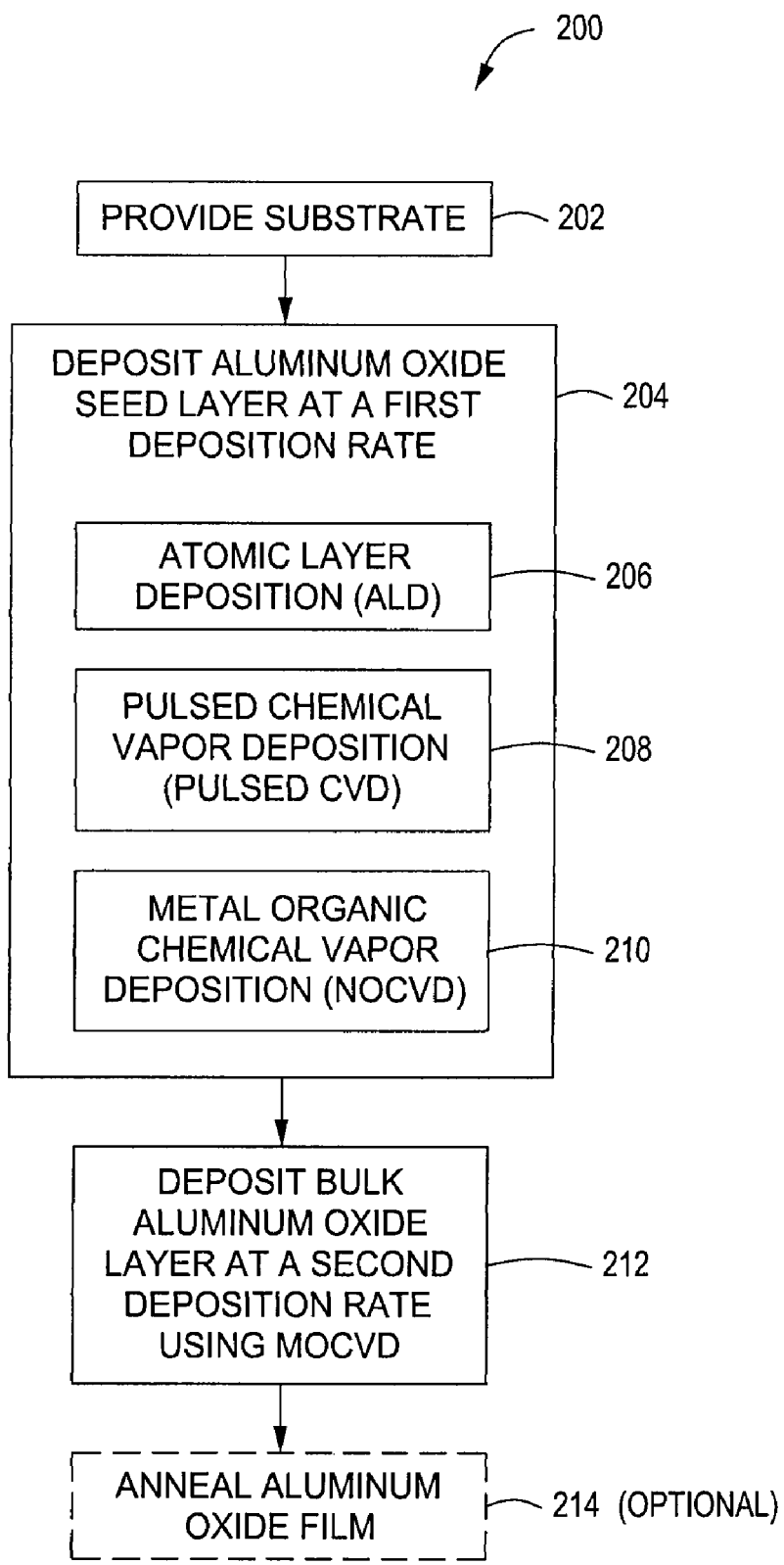
FIG. 2 illustrates a flow chart of an exemplary process for forming an aluminum oxide layer on a substrate in accordance with one embodiment of the invention.

FIG. 2 illustrates a process flow chart of a method 200 for forming an aluminum oxide layer on a substrate using an MOCVD process. The method 200 may be performed on a common platform, such as the integrated tool 100 described above. Alternatively, the method may be performed in individual process chambers. Method 200 is described below with respect to FIGS. 3A-C which illustrate a substrate during various stages of the process sequence as referred to in FIG. 2.

Figure 3A:
FIGS. 3A-C illustrate a substrate during various stages of the process sequence referred to in FIG. 2.

The method 200 begins at 202, by providing a substrate 302. The substrate 302, as shown in FIG. 3A, refers to any substrate or material surface upon which a film processing is performed. In some embodiments, the substrate 302 may be a material, such as a silicon, an oxygen a crystalline silicon (e.g., Si<100> or Si<111>), a silicon oxide, a strained silicon, a silicon germanium, a doped or an undoped polysilicon, doped or undoped silicon wafers, patterned or non-patterned wafers, a silicon on insulator (SOI), carbon doped silicon oxides, a silicon nitride, a doped silicon, a germanium, a gallium arsenide, a glass, sapphire, a metal, a conductive material, or the like. In some embodiments, the substrate 302 may have various dimensions, such as 200 mm or 300 mm diameter wafers, as well as rectangular or square panels.

Figure 3B:
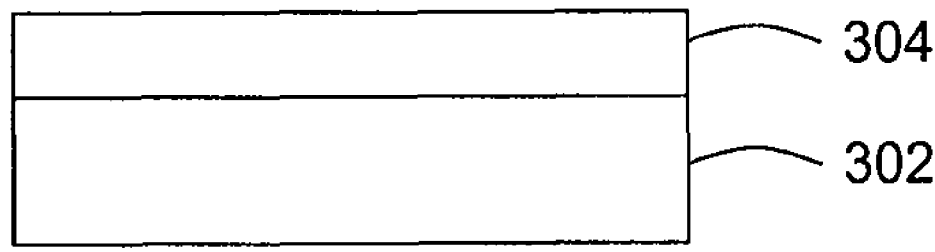
Figure 3C:
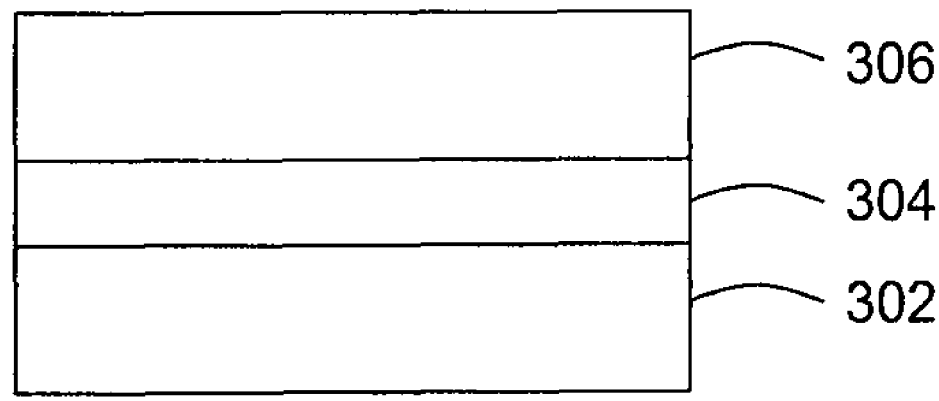

At 204, an aluminum oxide ($Al_2O_3$) seed layer 304 is deposited on the substrate 302 at a first deposition rate, as shown in FIG. 3B. The seed layer 304 may be deposited by a process selected from a group including atomic layer deposition (ALD), pulsed chemical vapor deposition (pulsed CVD), or metalorganic chemical vapor deposition (MOCVD), and may be performed in any suitable process chamber such one of chambers 114A-D in the tool 100. In some embodiments, the seed layer 304 is deposited to a thickness of between about 3 to about 20 Angstroms.

In some embodiments (as shown at 206), the seed layer 304 may be deposited by an ALD process. In some embodiments, ALD comprises depositing a first layer using an aluminum-containing gas, depositing a second layer using an oxygen-containing gas, and purging the process chamber with an inert gas, wherein the deposition of each layer and the purging of the process chamber comprise one cycle. In some embodiments, between about 2 to about 5 cycles are performed during the deposition of the seed layer 304. It is contemplated that about 2 to about 5 cycles may be necessary to deposit a seed layer having sufficient thickness and quality for serving as an adequate template for the deposition of a bulk layer 306 as discuss below.

In some embodiments, the aluminum-containing gas comprises at least one of triethyl(tri-sec-butoxy)dialuminum (EBDA), trimethyl aluminum (TMA), or tetrakis[diethylamino]aluminum (TDEAA, $Al[N(C_2H_5)_2]_4$). The aluminum-containing gas may have a flow rate of up to about 50 milligrams per minute, and may be flowed for a duration of up to about 5 seconds. In some embodiments, the aluminum-containing gas may be flowed in combination with a inert gas. In some embodiments, the inert gas is nitrogen ($N_2$) flowed at a flow rate of up to about 14 liters per minute. In some embodiments, the flow rate of $N_2$ is between about 7 to about 14 liters per minute.

In some embodiments, the oxygen-containing gas comprises oxygen ($O_2$). The oxygen-containing gas may have a flow rate of up to about 7 liters per minute, and may be flowed for a duration of up to about 10 seconds. In some embodiments, the oxygen-containing gas may be flowed in combination with a inert gas. In some embodiments, the inert gas is nitrogen ($N_2$) flowed at a flow rate of up to about 14 liters per minute. In some embodiments, the flow rate of $N_2$ is between about 7 liters per minute. In one embodiment, the flow rate of $O_2$ exceeds the flow rate of $N_2$.

In some embodiments, purging may be performed using an inert gas including nitrogen ($N_2$). In some embodiments, nitrogen ($N_2$) may be provided at a flow rate of up to about 14 liters per minute, and in the absence of both the aluminum-containing gas and the oxygen-containing gas.

During ALD of the seed layer 304, the substrate 302 may be maintained at a temperature between about 500 to about 800 degrees Celsius. In some embodiments, the temperature is maintained between about 680 to about 700 degrees Celsius. In one particular embodiment, the temperature is maintained at about 630 degrees Celsius. In some embodiments, pressure in the process chamber is maintained at about 0.5 to about 3.5 Torr.

Alternatively, in some embodiments (as shown at 208), the seed layer 304 may be deposited by a pulsed CVD process. Pulsed CVD comprises depositing a layer by pulsing the aluminum-containing gas and the oxygen-containing gas and purging the process chamber with an inert gas, wherein the deposition of each layer and the purging of the process chamber comprise one cycle. A pulse comprises providing the aluminum-containing gas and the oxygen-containing gas for a pulse duration. In some embodiments, the pulse duration may be between about 5 and 10 seconds. Cycles are generally performed until the seed layer has sufficient thickness and quality for serving as an adequate template for the deposition of a bulk layer 306 as discuss below. In one embodiment, 2 to 5 cycles are performed during the deposition of the seed layer 304.

The aluminum-containing gas may be provided at a flow rate of up to about 50 milligrams per minute. The oxygen-containing gas may be provided at a flow rate of up to about 7 liters per minute. In one particular embodiment, EDBA is provided at about 40 milligrams per minute and $O_2$ is provided at about 7.2 liters per minute.

In some embodiments, the aluminum-containing gas and the oxygen-containing gas may be flowed in combination with an inert gas. In some embodiments, the inert gas is nitrogen ($N_2$) flowed at a flow rate of up to about 14 liters per minute. In some embodiments, the flow rate of $N_2$ is between about 7 to about 14 liters per minute. In one embodiment, the flow rate of $O_2$ exceeds the flow rate of $N_2$.

During pulsed CVD of the seed layer 304, the substrate 302 may be maintained at a temperature between about 500-800 degrees Celsius. In some embodiments, the temperature is maintained between about 680-700 degrees Celsius. In one particular embodiment, the temperature is maintained at about 630 degrees Celsius. In some embodiments, pressure in the process chamber is maintained at about 0.5 to about 3.5 Torr.

Alternatively, in some embodiments (as shown at 210), the seed layer may be deposited by an MOCVD process. MOCVD may be distinguished over pulsed CVD in that the aluminum-containing gas is required to be a metalorganic precursor. In some embodiments, the metalorganic precursor includes at least one of triethyl(tri-sec-butoxy)dialuminum (EBDA), trimethyl aluminum (TMA), or tetrakis[diethylamino]aluminum (TDEAA, $Al[N(C_2H_5)_2]_4$). The deposition of the seed layer 304 by MOCVD may be performed either by pulsing as described above for pulsed CVD or by a continuous process.

In some embodiments, the seed layer is deposited by an MOCVD process, wherein the metalorganic precursor and the oxygen-containing gas are supplied simultaneously to form the seed layer 304. The metalorganic precursor and the oxygen-containing gas may be provided continuously for a duration of up to about 30 seconds. In some embodiments, the duration may be between about 5 to about 30 seconds.

In some embodiments, the metalorganic precursor is provided at a flow rate of up to about 10 milligrams per minute. In some embodiments, the flow rate of the aluminum-containing organic gas may be between about 5 to about 10 milligrams per minute. In some embodiments, the flow rate of the metalorganic precursor may be less than about 5 mg per minute.

The oxygen-containing gas may be provided at a flow rate up to about 14 liters per minute. In one embodiment, the oxygen-containing gas is provided at a flow rate of about 7.2 liters per minute.

The metalorganic precursor and the oxygen-containing gas may be flowed in combination with an inert gas. In some embodiments, the inert gas includes nitrogen ($N_2$). The inert gas may be provided at a flow rate of up to about 14 liters per minute. In one embodiment, the inert gas is provided at a flow rate of about 7 liters per minute. In one embodiment, the flow rate of $O_2$ exceeds the flow rate of $N_2$.

During MOCVD of the seed layer 304, the substrate 302 may be maintained at a temperature between about 500-800 degrees Celsius. In some embodiments, the temperature is maintained between about 680-700 degrees Celsius. In one embodiment, the temperature is maintained at about 630 degrees Celsius. In some embodiments, pressure in the process chamber is maintained at about 0.5 to about 3.5 Torr.

At 212, a bulk aluminum oxide ($Al_2O_3$) layer 306 is deposited atop the seed layer 304 at a second deposition rate using MOCVD as shown in FIG. 3B. The MOCVD process for the deposition of the bulk layer 306 is similar to that used to deposit the seed layer 304 at 210, wherein a metalorganic precursor (e.g., a second metalorganic precursor) and an oxygen-containing gas (e.g., a second oxygen-containing gas) are provided to form the bulk layer 306. The second metalorganic precursor provides aluminum for the formation of the bulk aluminum oxide layer 206. The second metalorganic precursor may include at least one of triethyl(tri-sec-butoxy) dialuminum (EBDA), trimethyl aluminum (TMA), or tetrakis [diethylamino]aluminum (TDEAA, $Al[N(C_2H_5)_2]_4$). However, the second deposition rate, used to deposit the bulk layer 306, is greater than the first deposition rate which is used to deposit the seed layer 304. In some embodiments, the second deposition rate exceeds the first deposition rate by between about 2 times to about 10 times.

In some embodiments, the bulk layer 306 is deposited by a MOCVD process, wherein the second metalorganic precursor and the second oxygen-containing gas are supplied simultaneously to form the seed layer 304. The second metalorganic precursor and the second oxygen-containing gas may be provided continuously for a duration of up to about 120 seconds. In some embodiments, the duration may be between about 70 to about 80 seconds. In some embodiments, the bulk layer 306 is deposited to a thickness between about 100 to about 200 Angstroms.

In some embodiments, the second metalorganic precursor is provided at a flow rate of up to about 40 milligrams per minute. In some embodiments, the flow rate of the second metalorganic precursor may be between about 1 to 80 milligrams per minute. In one embodiment, the flow rate of the second metalorganic precursor is about 40 milligrams per minute.

In some embodiments, the second oxygen-containing gas is provided at a flow rate up to about 14 liters per minute. In one embodiment, the second oxygen-containing gas is provided at a flow rate of about 7.2 liters per minute.

The second metalorganic precursor and the second oxygen-containing gas may be flowed in combination with an inert gas. In some embodiments, the inert gas includes nitrogen ($N_2$). The inert gas may be provided at a flow rate of up to about 14 liters per minute. In one embodiment, the inert gas is provided at a flow rate of about 7 liters per minute. In one embodiment, the flow rate of $O_2$ exceeds the flow rate of $N_2$.

During MOCVD of the bulk layer 306, the substrate 302 may be maintained at a temperature between about 500 to about 800 degrees Celsius. In some embodiments, the temperature is maintained between about 680 to about 700 degrees Celsius. In one embodiment, the temperature is maintained at about 630 degrees Celsius. In some embodiments, pressure in the process chamber is maintained at about 0.5 to about 3.5 Torr.

A deposition rate (i.e., the first deposition rate or the second deposition rate) can be controlled by at least one of temperature or flow rate of the aluminum-containing gas, the metalorganic precursor, or the second metalorganic precursor. In some embodiments, the seed layer may be deposited at a first temperature using the metalorganic precursor provided at a first flow rate and the bulk layer may be deposited at a second temperature using the second metalorganic precursor provided at a second flow rate. In one embodiment, at least one of the first flow rate or first temperature is less than at least one of the second flow rate or second temperature, and thus ensures the second deposition rate of the bulk layer 306 is greater than the first deposition rate of the seed layer 304.

Optionally, at 214, the aluminum oxide layer comprising the seed layer 304 and the bulk layer 306 may be annealed. The annealing process may be performed in any one of the chambers 114A-D configured as an annealing chamber. A suitable annealing chamber may be, for example the RADIANCE™ RTP chamber, available from Applied Materials, Inc., of Santa Clara, Calif.

The anneal may be performed in the presence of one or more annealing gases which may be selected from a group including oxygen ($O_2$), ozone ($O_3$), atomic oxygen (O), hydrogen ($H_2$), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), and hydrazine ($N_2H_4$). In some embodiments, the annealing gas includes hydrogen ($H_2$) and oxygen ($O_2$).

In some embodiments, the anneal may be performed at temperature between about 700 to about 900 degrees Celsius and for a duration up to about 30 seconds. In some embodiments, the annealing gas may comprise about 70 to about 85 percent oxygen ($O_2$). In some embodiments, the annealing gas may comprise about 15-25 percent hydrogen ($H_2$). In one embodiment, the aluminum oxide layer is annealed at 700 degrees Celsius for about 30 seconds in the presence of an annealing gas comprising 85% $O_2$ and 15% $H_2$.

Thus, methods for forming an aluminum oxide layer are provided herein. In some embodiments, the method includes depositing an aluminum oxide seed layer on the substrate using a first process having a first deposition rate, and depositing a bulk aluminum oxide layer atop the seed layer using a metalorganic chemical vapor deposition (MOCVD) process having a second deposition rate greater than the first deposition rate. The inventive methods may advantageously reduce surface roughness in the bulk $Al_2O_3$ layer while maintaining a high deposition rate and layer quality.

While the foregoing is directed to embodiments of the invention, other and further embodiments of the invention may be devised without departing from the basic scope thereof, and the scope thereof is determined by the claims that follow.

The invention claimed is:

1. A method of forming an aluminum oxide layer on a substrate, comprising:
    depositing an aluminum oxide seed layer on a substrate using a first process having a first deposition rate; and
    depositing a bulk aluminum oxide layer atop the seed layer using a metalorganic chemical vapor deposition (MOCVD) process having a second deposition rate greater than the first deposition rate.

2. The method of claim 1, wherein the MOCVD process further comprises:
    flowing a metalorganic precursor and an oxygen-containing gas into a process chamber having the substrate contained therein; and
    forming the bulk layer on the substrate from aluminum, provided by the metalorganic precursor, and the oxygen-containing gas.

3. The method of claim 2, wherein the MOCVD process further comprises:
    flowing nitrogen ($N_2$) along with the metalorganic precursor.

4. The method of claim 2, wherein the metalorganic precursor is at least one of triethyl(tri-sec-butoxy)dialuminum (EBDA), trimethyl aluminum (TMA), or tetrakis[diethylamino]aluminum (TDEAA, $Al[N(C_2H_5)_2]_4$).

5. The method of claim 2, wherein the oxygen-containing gas is oxygen ($O_2$).

6. The method of claim 2, wherein the seed layer is deposited to a thickness of between about 3 to about 20 Angstroms.

7. The method of claim 2, wherein the bulk layer is deposited to a thickness of between about 100 to about 200 Angstroms.

8. The method of claim 2, wherein the seed layer is deposited by at least one of an atomic layer deposition (ALD) process, a pulsed chemical vapor deposition (pulsed CVD) process, or a metalorganic chemical vapor deposition (MOCVD) process.

9. The method of claim 8, wherein depositing the seed layer further comprises:
    pulsing an aluminum-containing gas and an oxygen-containing gas; and
    maintaining the substrate at a first temperature;
    wherein depositing the bulk layer further comprises:
        flowing a second process gas at a second flow rate; and
        maintaining the substrate at a second temperature,
    wherein the first temperature is less than the second temperature.

10. The method of claim 9, wherein depositing the seed layer further comprises:
    purging the aluminum-containing gas and the oxygen-containing gas, wherein the pulsing and purging of the aluminum-containing gas and the oxygen-containing gas comprise a cycle.

11. The method of claim 10, wherein the pulsing and purging of the aluminum-containing gas and the oxygen-containing gas is repeated for about 2 to about 5 cycles.

12. The method of claim 10, wherein the pulsing or the purging has a duration between about 1 to about 10 seconds between gases.

13. The method of claim 10, wherein a gas utilized for the pulsing and the purging comprises nitrogen ($N_2$).

14. The method of claim 13, wherein the nitrogen has a flow rate of between about 7 to about 14 liters/minute.

15. The method of claim 10, wherein the aluminum-containing gas has a flow rate of up to about 50 milligrams/minute.

16. The method of claim 10, wherein the oxygen-containing gas has a flow rate of up to about 7 liters/minute.

17. The method of claim 1, wherein the substrate comprises silicon and oxygen.

18. The method of claim 1, further comprising:
    depositing the seed layer by flowing a first process gas comprising a metalorganic precursor and an oxygen-containing gas, wherein the metalorganic precursor includes aluminum and is provided at a first flow rate, and maintaining the substrate at a first temperature; and
    depositing the bulk layer by flowing a second process gas comprising a second metalorganic precursor and a second oxygen-containing gas, wherein the second metalorganic precursor is provided at a second flow rate, and maintaining the substrate at a second temperature;
    wherein at least one of the first flow rate or the first temperature is less than at least one of the second flow rate or the second temperature.

19. The method of claim 18, wherein the second process gas further comprises nitrogen ($N_2$) provided at a flow rate of about 2 to about 7 liters/minute.

20. The method of claim 18, wherein depositing the seed layer further comprises:
    providing the metalorganic precursor at a flow rate of about 1 to about 10 milligrams/minute.

21. The method of claim 18, wherein depositing the seed layer further comprises:
    providing the oxygen-containing gas at a flow rate of between about 2 to about 7 liters/minute.

22. The method of claim 18, wherein the second temperature is between about 500 to about 800 degrees Celsius.

23. The method of claim 1, further comprising:
    annealing the deposited aluminum oxide layer in a process gas comprising at least one of hydrogen ($H_2$) and oxygen ($O_2$).

* * * * *